(12) United States Patent
Hui

(10) Patent No.: US 6,391,729 B1
(45) Date of Patent: May 21, 2002

(54) SHALLOW TRENCH ISOLATION FORMATION TO ELIMINATE POLY STRINGER WITH CONTROLLED STEP HEIGHT AND CORNER ROUNDING

(75) Inventor: Angela Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/521,342

(22) Filed: Mar. 9, 2000

(51) Int. Cl.⁷ ........................ H01L 21/336; H01L 21/16
(52) U.S. Cl. ........................ 438/296; 438/400; 438/424
(58) Field of Search .................................. 438/400, 296, 438/424

(56) References Cited

U.S. PATENT DOCUMENTS 6,071,792 A * 6/2000 Kim et al.
6,238,999 B1 * 5/2001 Dickerson et al.
6,261,921 B1 * 7/2001 Yen et al.

* cited by examiner

Primary Examiner—John F. Niebling
Assistant Examiner—Josetta I. Jones
(74) Attorney, Agent, or Firm—Foley & Lardner

(57) ABSTRACT

A method of fabricating an integrated circuit including multiple devices and isolation structures separating the multiple devices includes depositing a mask layer with a first thickness above a semiconductor substrate, forming an aperture in the mask, and trimming the mask layer to a second thickness where the second thickness is less than the first thickness.

20 Claims, 5 Drawing Sheets

SHALLOW TRENCH ISOLATION FORMATION TO ELIMINATE POLY STRINGER WITH CONTROLLED STEP HEIGHT AND CORNER ROUNDING

FIELD OF THE INVENTION

The present invention relates generally to the field of integrated circuits and to methods of manufacturing integrated circuits. More particularly, the present invention relates to a method of shallow trench formation to eliminate residual material or "poly stringer" with controlled step height and corner rounding.

BACKGROUND OF THE INVENTION

Semiconductor devices or integrated circuits (ICs) can include millions of devices, such as, transistors. Different isolation techniques are utilized to provide electrical isolation between devices fabricated on the same piece of silicon. One isolation technique is local oxidation of silicon (LOCOS). LOCOS is often employed to electrically insulate or isolate various portions or structures of the semiconductor device from other portions of the device. Another isolation technique for isolating devices of the same type is shallow trench isolation (STI).

Conventional STI formation uses a thick layer of nitride as a hard mask. The nitride thickness depends on the litho printing capability, normally at the range of 1400–1800 angstroms (Å). This nitride layer or hard mask provides a chemical-mechanical polish (CMP) stop layer for the oxide gap material, which is removed after trench oxide gap fill. After the nitride layer is removed, an uneven formation or relatively large step may e created on the top surface of the substrate. The large step is due to the height of the oxide gap fill which generally has the same height as the nitride layer. Disadvantageously, residual material or "poly stringer" from subsequent deposition, masking, and photolithographic steps can form along the large step. Failure to remove this material can lead to unwanted electrical shorting paths between adjacent lines.

Thus, there is a need for a method of shallow trench formation with reduced poly stringer problems. Further, there is a need for a method of shallow trench isolation formation with controlled step height and corner rounding. Even further, there is a need for an integrated circuit manufactured by a technique in which the mask layer used in shallow trench isolation formation is thinner than conventional mask layer.

SUMMARY OF THE INVENTION

An exemplary embodiment is related to a method of fabricating an integrated circuit including multiple devices and isolation structures separating the multiple devices. This method includes depositing a mask layer with a first thickness above a semiconductor substrate, forming an aperture in the mask, and trimming the mask layer to a second thickness where the second thickness is less than the first thickness.

Briefly, another exemplary embodiment is related to an integrated circuit including at least two isolation structures on a common semiconductor material. The integrated circuit is manufactured in a process including providing a mask layer with a first thickness over a semiconductor substrate, selectively creating a trench in the semiconductor substrate, and thinning the mask layer to a second thickness. The second thickness is less than the first thickness.

Briefly, another embodiment is related to a method of manufacturing an integrated circuit including the steps of (a) performing a shallow trench isolation etch to form a trench in a substrate, an oxide liner proximate the trench and disposed over the substrate, and a mask layer disposed over the oxide liner; and (b) trimming the mask layer.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
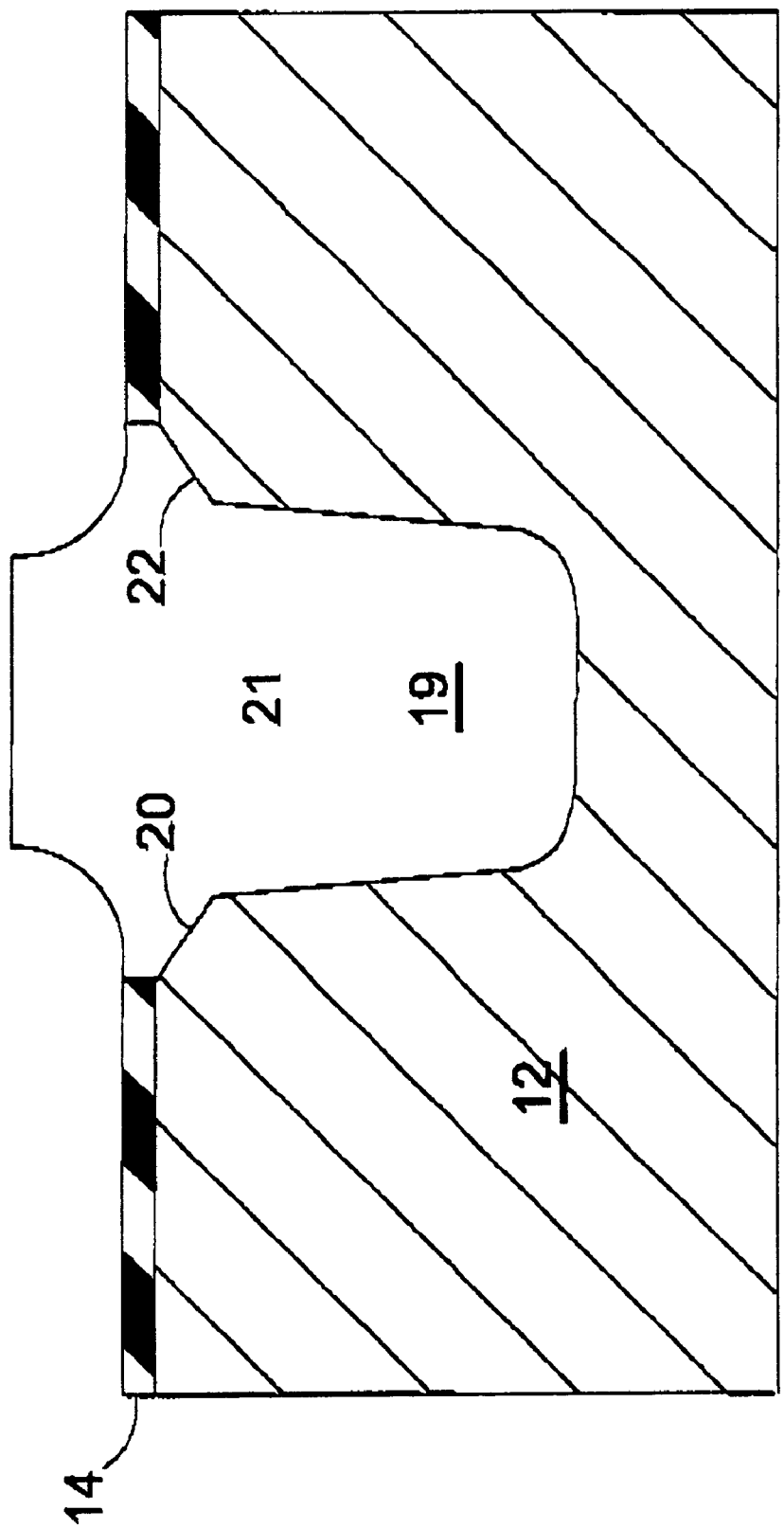
FIG. 1 is cross-sectional view of a portion of an integrated circuit fabricated in accordance with an exemplary embodiment of the present invention.

Referring to FIG. 1, a cross-sectional view of a portion 10 of an integrated circuit (IC) includes a substrate 12 and an oxide liner 14. Portion 10 is preferably part of an ultra-large-scale integrated (ULSI) circuit having millions or more transistors. Portion 10 is manufactured as part of the IC on a semiconductor wafer, such as, a silicon wafer.

Substrate 12 is preferably silicon. Oxide liner 14 can be silicon dioxide ($SiO_2$) or other insulating material disposed over substrate 12. Preferably, oxide liner 14 is 100–200 angstroms thick. Substrate 12 includes a trench 19 which is filled by a material 21. Preferably, trench 19 is 3000–4000 angstroms wide and 2000–4000 angstroms deep. Trench 19 is characterized by rounded corners 20 and 22. Preferably, rounded corners 20 and 22 extend 50–200 angstroms in depth below the top surface of substrate 12. The slope of rounded corners 20 and 22 has an angle of 50–75° with respect to the horizontal plane of substrate 12.

Trench 19 provides a location for material 21 which then electrically isolates portions of the IC. Generally, the electrical isolation is needed to separate active regions in the IC. Active regions are areas in the IC between isolation structures which include impurities or dopants such as a p-type dopant (e.g., boron) or an n-type dopant (e.g., phosphorous). In a preferred embodiment, material 21 which fills trench 19 is silicon dioxide deposited in a tetraethyl orthosilicate (TEOS) process and extends 500–1100 angstroms above oxide liner 14.

A mask 16 (FIGS. 2–5) can be disposed over oxide liner 14 in the semiconductor fabrication steps, as described with reference to FIGS. 2–5. Mask 16 can be a material, such as, silicon nitride ($Si_3N_4$) and is disposed over oxide liner 14.

Figure 2:
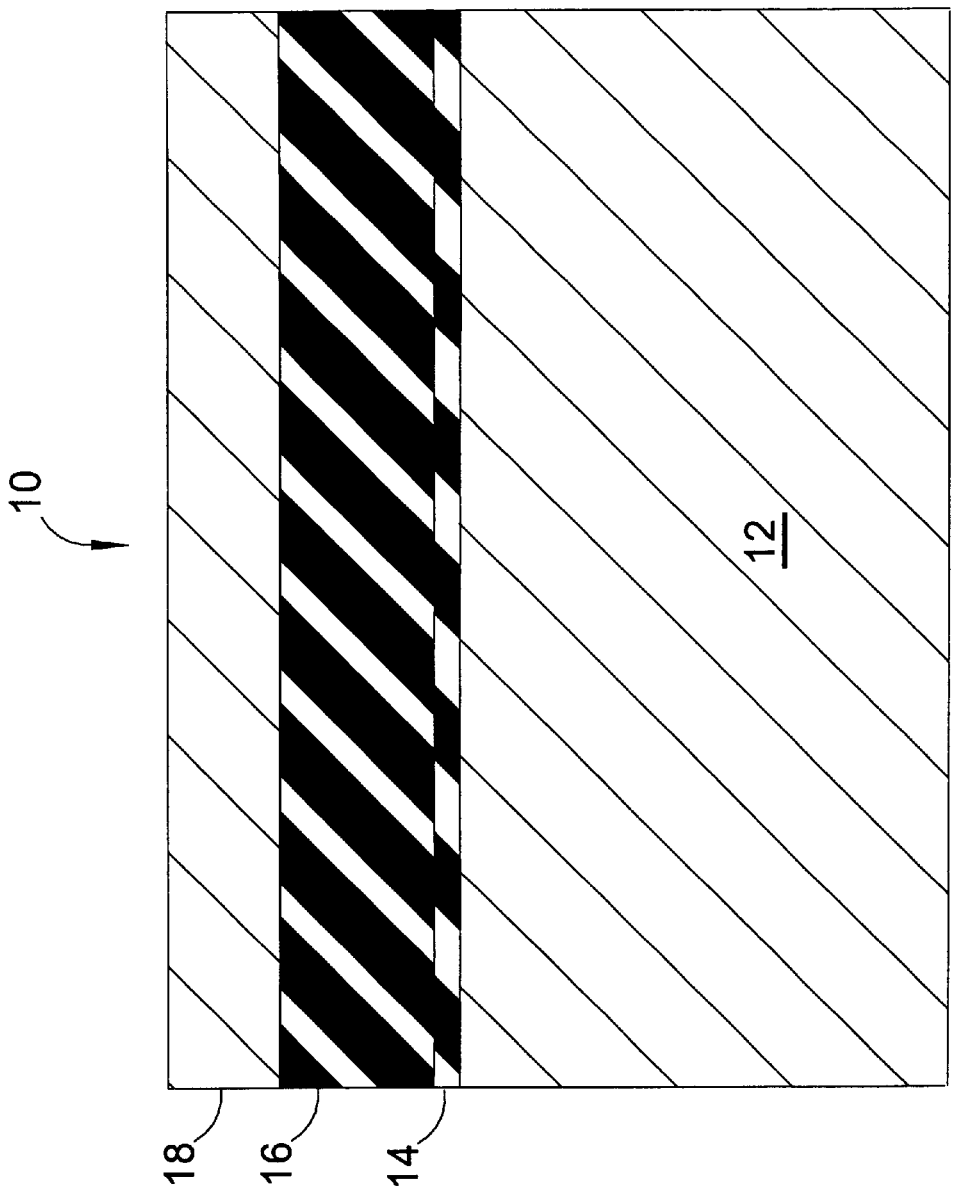
FIG. 2 is a cross-sectional view of a portion of the integrated circuit illustrated in FIG. 1, before a conventional shallow trench isolation etch.

The method of forming portion 10 is described below with reference to FIGS. 1–5. The method advantageously forms portion 10 including controlled step height and corner rounding. In FIG. 2, a cross-sectional view of portion 10 illustrates portion 10 before a conventional STI etch, including a resist 18 disposed over mask 16. Resist 18 is a photoresist layer selectively etched to define trench 19 in substrate 12 (FIG. 1). Preferably, resist 18 is 7000–10,000 Å in height or thickness. Preferably, mask 16 is 1400–1800 Å thick and deposited by CVD. Mask 16 is deposited over oxide liner 14, which has a preferable thickness of 100–200 angstroms. Liner 14 can be deposited or thermally grown.

Figure 3:
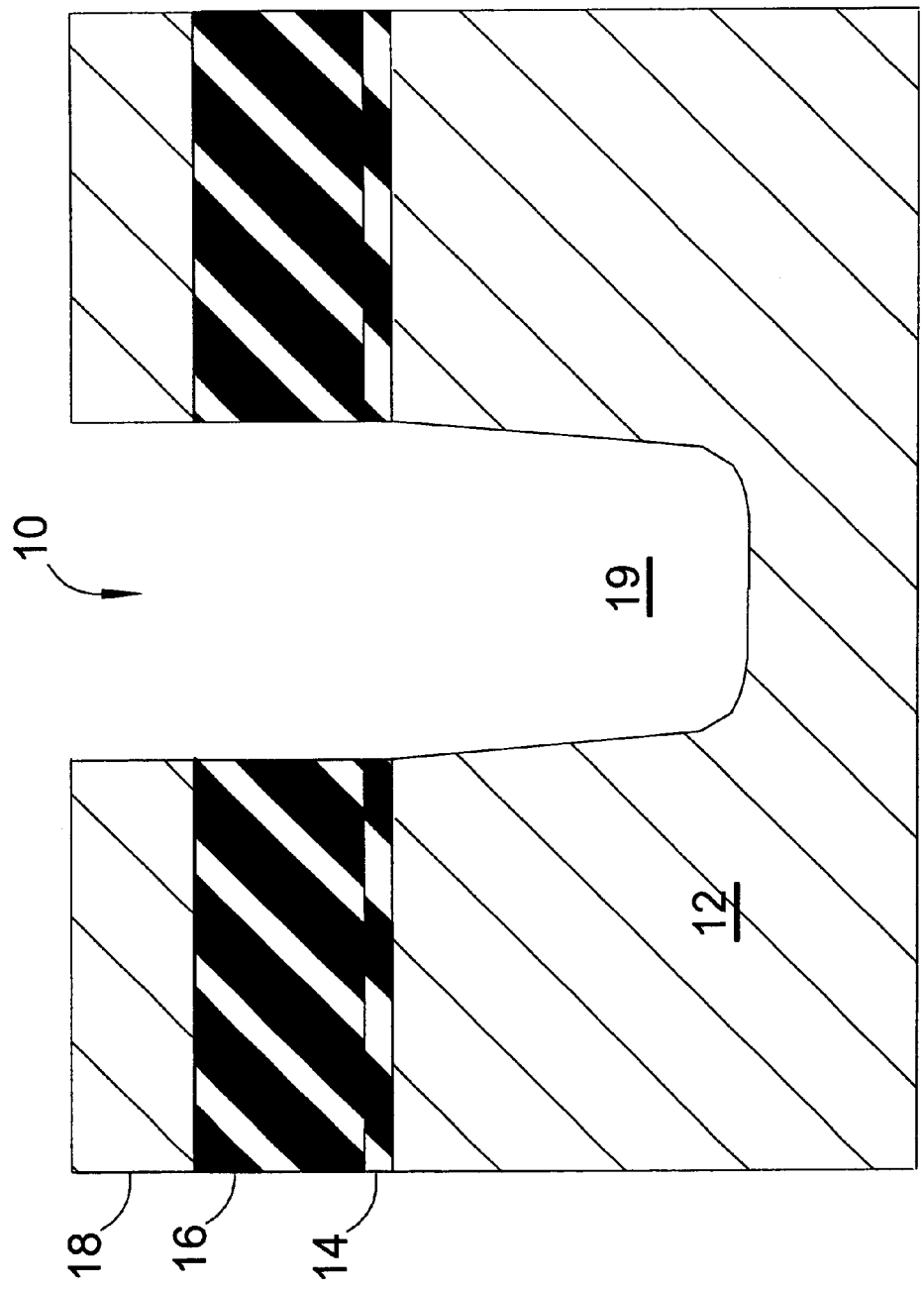
FIG. 3 is a cross-sectional view of a portion of the integrated circuit illustrated in FIG. 1, after a conventional shallow trench isolation etch.
Figure 4:
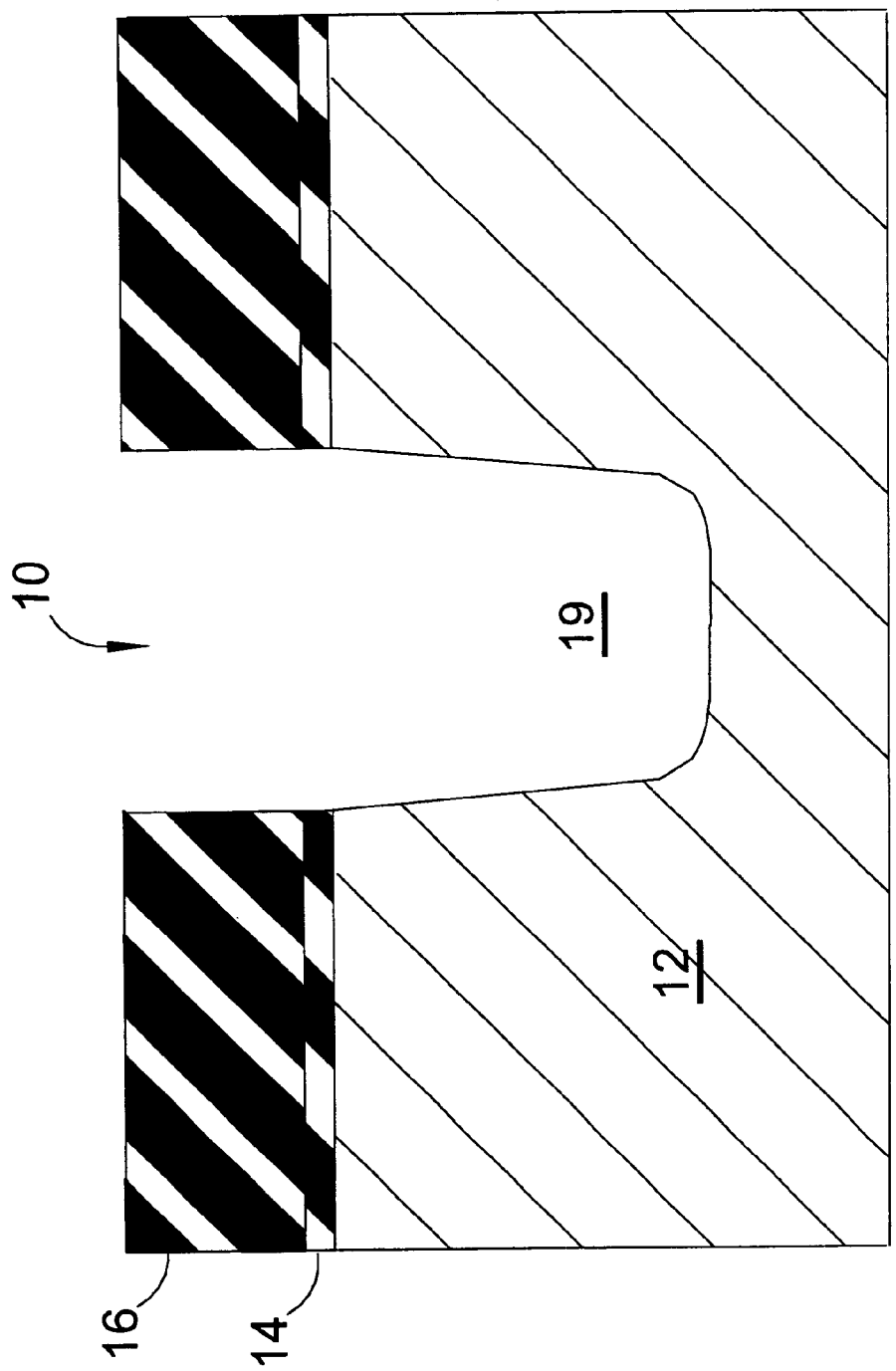
FIG. 4 is a cross-sectional view of a portion of the integrated circuit illustrated in FIG. 1, showing a mask layer disposed over an oxide liner.

In FIG. 3, a cross-sectional view of portion 10 is shown after a conventional STI etch which creates trench 19. The STI etch removes portions or creates apertures in resist 18, mask 16, and oxide liner 14. In one embodiment, trench 19 has a width of 3000–4000 angstroms at oxide layer 14 and a depth of 2000–4000 angstroms from oxide layer 14. In FIG. 4, a cross-sectional view of portion 10 is shown after trench 19 is formed and resist 18 is removed or stripped. Resist 18 can be removed in any of a variety of known ways, such as, dry or wet etching.

Figure 5:
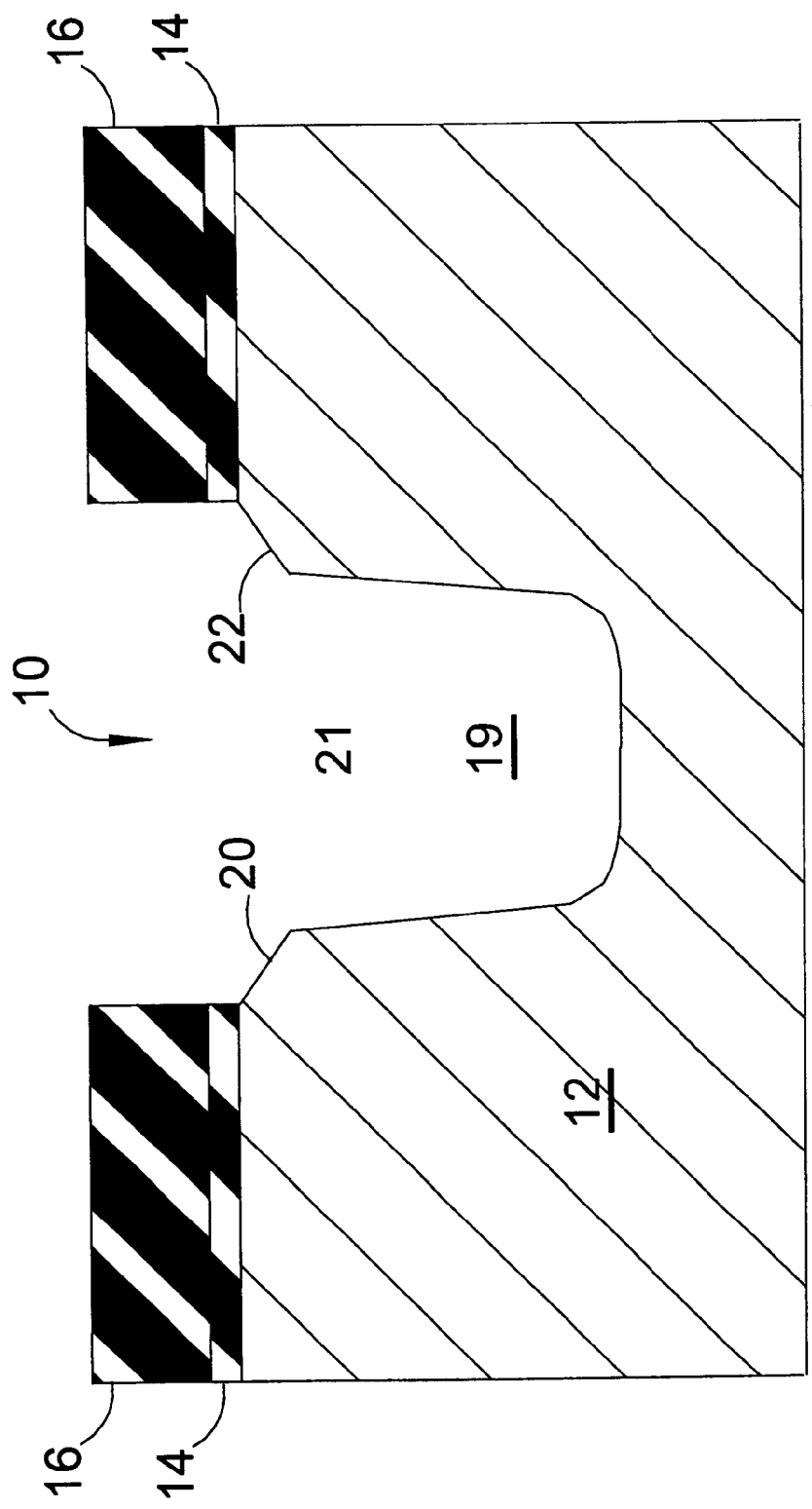
FIG. 5 is a cross-sectional view of a portion of the integrated circuit illustrated in FIG. 1, showing a mask layer thinning step.

Once resist 18 is removed, mask 16 is thinned. FIG. 5 shows a cross-sectional view of portion 10 after mask 16 is thinned. Preferably, a plasma etch method is used to thin mask 16 to a desired height. In this method, an isotropic plasma etch with a low silicon selectivity is used to remove the desired amount of the nitride hard mask. In an exemplary embodiment, the height or thickness of thin mask 16 is 900–1300 angstroms. This method also provides a rounding of the gap in substrate 12 at rounded corners 20 and 22. In one embodiment, rounded corners 20 and 22 slope down between 50–200 angstroms horizontally and 50–200 angstroms vertically.

Conventional oxide trench fill procedures are used to fill trench 19. For example, trench 19 can be filled with material 21 in a TEOS-based CVD process. An oxide liner can be grown within trench 19 before it is filled with material 21. The oxide fill (not shown) is preferably polished down to modified thinner mask 16 by 200–400 angstroms. Mask 16 is then removed and, as shown in FIG. 1, a much smaller step than steps associated with conventional processes is formed between oxide liner 14 and material 21. Preferably, the step is 700 angstroms in thickness. In alternative embodiments, the step can range in thickness from 500 to 1100 angstroms.

The technique disclosed, and described with reference to FIGS. 1–5, includes an approach to thinning down the step height between oxide liner 14 and oxide fill of material 21 in trench 19 during shallow trench isolation (STI) formation. Advantageously, portion 10 fabricated in accordance this technique eliminates poly stringer along the steps between trench 19 and oxide liner 14 and shortens the amount of poly overetch for better yield control. For example, in an exemplary embodiment, the amount of poly overetch is shortened from 120% to 60%. Better (straighter) poly profile can be achieved with less over etch.

While the embodiments illustrated in the FIGURES and described above are presently preferred, it should be understood that these embodiments are offered by way of example only. Other embodiments may include, for example, different methods of trimming mask 16 or reducing the overall height or thickness of the step between the oxide fill and oxide liner 14. The invention is not limited to a particular embodiment, but extends to various modifications, combinations, and permutations that nevertheless fall within the scope and spirit of the appended claims.

What is claimed is:

1. A method of fabricating an integrated circuit including multiple devices and isolation structures separating the multiple devices, the method comprising:

depositing a mask layer above a semiconductor substrate, the mask layer having a first thickness;

forming an aperture in the mask layer:

forming a trench beneath the aperture In the semiconductor substrate; and trimming substantially the entire mask layer to a second thickness, the second thickness being less than the first thickness, wherein trimming the mask layer comprises rounding corners of the trench in the substrate.

2. The method of claim 1, further comprising filling the trench in the semiconductor substrate with a material after the trimming step.

3. The method of claim 1, wherein the first thickness is in the range of about 1400–1800 angstroms.

4. The method of claim 1, wherein the step of trimming the mask layer comprises using a plasma etch method.

5. The method of claim 1, wherein the second thickness is in the range of about 900–1300 angstroms.

6. A method of manufacturing an integrated circuit, the method comprising:

performing a shallow trench isolation etch, the shallow trench isolation etch forming a trench in a substrate, an oxide liner proximate the trench and disposed over the substrate, and a mask layer disposed over the oxide liner; and trimming the mask layer, wherein trimming the mask layer comprises reducing the thickness of substantially the entire mask layer and rounding corners of the trench in the substrate.

7. The method of claim 6, wherein the step of performing a shallow trench isolation etch comprises forming an aperture in the mask layer.

8. The method of claim 6, wherein the step of trimming the mask layer comprises performing an isotropic nitride trimming process.

9. The method of claim 6, wherein the step of trimming the mask layer comprises performing a plasma etch method.

10. The method of claim 6, further comprising providing an oxide fill by depositing a material into the trench.

11. The method of claim 10, further comprising removing the mask layer.

12. The method of claim 11 wherein the removed mask layer has a thickness of 500–1100 angstroms.

13. The method of claim 6, wherein the step of trimming the mask layer reduces the mask layer thickness by approximately 500 angstroms.

14. A method of forming shallow trenches with reduced poly stringer in an Integrated circuit, the method comprising;

forming a mask layer above a semiconductor substrate, the mask including an aperture;

forming a trench in the semiconductor substrate below the aperture; and etching the mask layer to decrease the thickness of substantially the entire mask layer and to alter the shape of the trench.

15. The method of claim 14, wherein etching the mask layer forms rounded corners in the trench.

16. The method of claim 14, wherein etching the mask layer comprises performing an isotropic plasma etch.

17. The method of claim 14, wherein etching the mask layer decreases the thickness of the mask layer by approximately 500 angstroms.

18. The method of claim 14, wherein prior to etching the mask layer the mask layer has a thickness of approximately 1400 to 1800 angstroms and after etching the mask layer the mask layer has a thickness of approximately 900 to 1300 angstroms.

19. The method of claim 14, further comprising filling the trench with a material after etching the mask layer.

20. The method of claim 19, wherein the material is an oxide material.

* * * * *

UNITED STATES PATENT AND TRADEMARK OFFICE
CERTIFICATE OF CORRECTION

PATENT NO. : 6,391,729 B1
DATED : May 21, 2002
INVENTOR(S) : Angela Hui

It is certified that error appears in the above-identified patent and that said Letters Patent is hereby corrected as shown below:

<u>Column 4,</u>
Line 13, delete ":" and insert therefor -- ; --.
Line 14, delete "In" and insert therefor -- in --.
Line 58, delete "Integrated" and insert therefor -- integrated --.
Line 59, delete ";" and insert therefor -- : --.

Signed and Sealed this

Twenty-third Day of July, 2002

*Attest:*

JAMES E. ROGAN
*Attesting Officer*     *Director of the United States Patent and Trademark Office*